United States Patent [19]
Traub

[11] 4,395,642
[45] Jul. 26, 1983

[54] SINE-SHAPING CIRCUIT

[75] Inventor: Stefan Traub, Boeblingen, Fed. Rep. of Germany

[73] Assignee: Hewlett-Packard GmbH, Boeblingen, Fed. Rep. of Germany

[21] Appl. No.: 215,296

[22] Filed: Dec. 11, 1980

Related U.S. Application Data

[63] Continuation of Ser. No. 204,678, Nov. 5, 1980.

[30] Foreign Application Priority Data

Nov. 8, 1979 [DE] Fed. Rep. of Germany ....... 2945093
Oct. 24, 1980 [EP] European Pat. Off. ........ 80106510.3

[51] Int. Cl.³ .......................... H03K 5/00; G06G 7/16
[52] U.S. Cl. ..................................... 307/261; 307/267; 328/27; 328/160
[58] Field of Search ....................... 307/261, 267, 295; 328/27, 160

[56] References Cited

U.S. PATENT DOCUMENTS 3,697,778  10/1972  Olson .................................. 307/261
3,995,222  11/1976  Mitarai ............................... 307/261
4,250,455   2/1981  Davis .................................. 307/261
4,283,637   8/1981  Handte et al. ...................... 307/261

Primary Examiner—Stanley D. Miller
Assistant Examiner—B. P. Davis
Attorney, Agent, or Firm—John A. Frazzini

[57] ABSTRACT

A circuit for converting a triangular waveform into a sinusoidal waveform using the non-linear transfer characteristic of a first transistor differential amplifier. Second and third differential amplifiers are parallel-connected to said first differential amplifier with the slopes of their transfer characteristics in opposite sense thereto and having their operating points shifted on their transfer characteristics in opposite directions with regard to each other and symmetrically to the operation point of said first differential amplifier so that the resulting overall transfer characteristic of said first, second and third differential amplifiers has zero slope at the extremal amplitudes of said triangular waveform.

3 Claims, 3 Drawing Figures

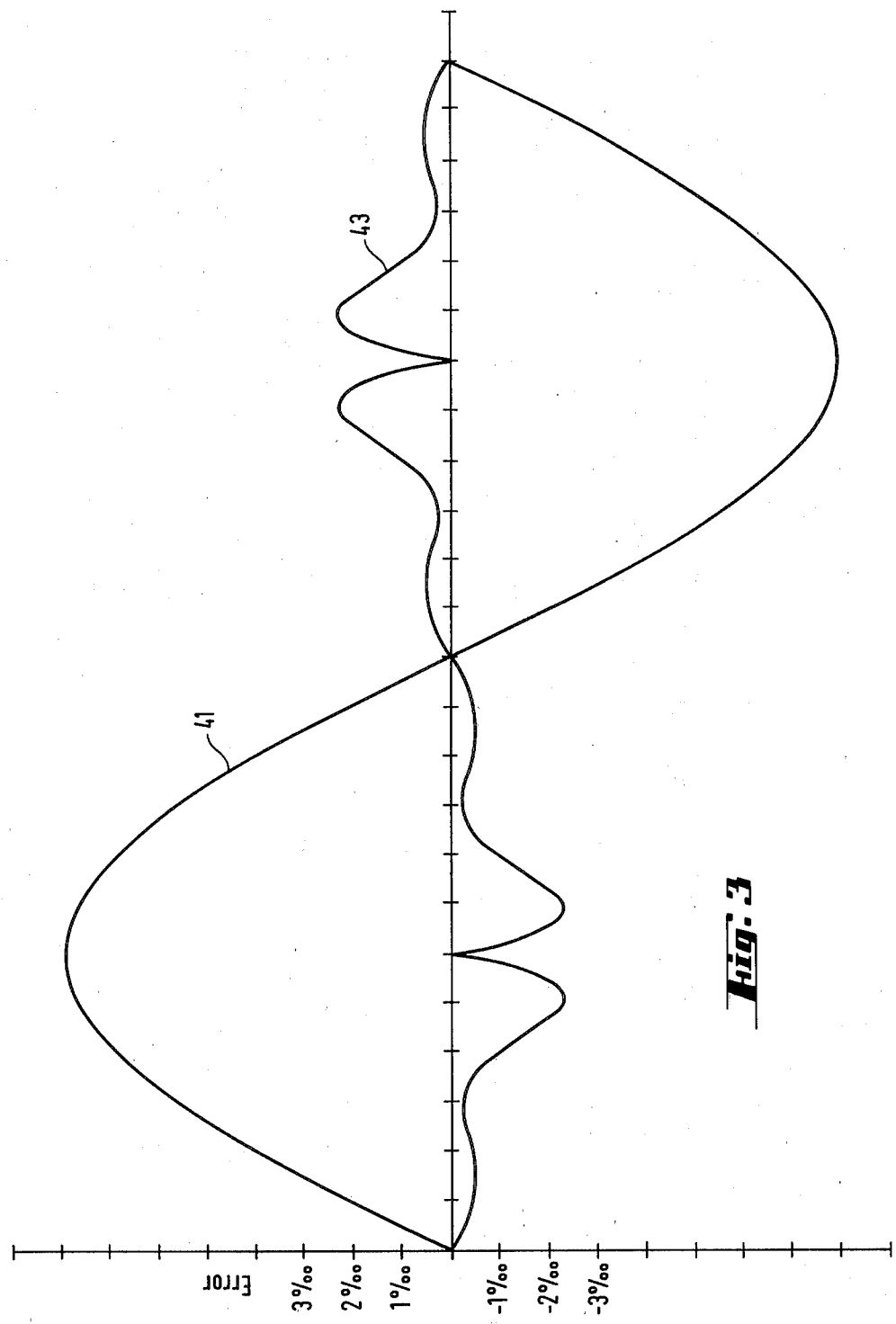

SINE-SHAPING CIRCUIT

This is a continuation of application Ser. No. 204,678, filed on Nov. 5, 1980.

BACKGROUND OF THE INVENTION

It is commonly known to use a diode network to convert a triangular voltage into a sinusoidal voltage. Such a diode network approximates the sinusoidal curve by converting the increasing and decreasing slopes of the triangular waveform into suitable sections of straight lines. For a good approximation of the sinusoidal waveform a relatively large number of such sections is required leading to an expensive and complicated circuit.

In IEEE Journal of Solid State Circuits, June 1976, page 418 a sine-shaping circuit is described which uses the non-linear transfer characteristic of a transistor differential amplifier for converting a triangular voltage into a sinusoidal voltage. Although this technique allows generation of sinusoidal voltages with relatively low harmonic distortion, it has a draw-back in that the sinusoidal waveform has a bend in its amplitude at both its maximum and minimum, i.e. its first derivative is discontinuous at its maximum and minimum. The reason for this effect is that the non-linear transfer characteristic of the differential amplifier has non-zero slope at its ends since its slope only approaches zero asymptotically.

In the published German patent application 2,613,338 a circuit is described wherein the triangular signal is simultaneously fed to two differential amplifiers, whereof the one has a non-linear and the other has a linear transfer characteristic. The output signals of these two differential amplifiers are subtracted from each other. Thus, the circuit has a combined transfer characteristic with a slope which becomes zero or even negative at its ends. If the circuit is modulated exactly up to the zero slope points of the combined characteristic, a sinusoidal waveform without bends may be generated. However, in this circuit the subtraction of two signals is disadvantageous since it may lead to substantial errors as is well known from the rules of error combination.

SUMMARY OF THE INVENTION

It is an object of the invention to provide a sine-shaping circuit which is capable of generating a sinusoidal signal having low harmonic distortion, continuous slope and high accuracy.

According to the invention the non-linear transfer characteristic of a first transistor differential amplifier is used to convert a triangular signal into a sinusoidal signal. Two additional differential amplifiers are connected in parallel with the first differential amplifier in such directions and with their operating points at such locations on their characteristics that the resulting characteristic of the circuit has zero slope at the amplitude extrema of the triangular signal. Although the circuit according to the invention is relatively inexpensive it generates an excellent sinusoidal signal. It may be designed using very fast components and also may be designed as an integrated circuit. Thus a sinusoidal signal of extremely high frequency can be generated.

BRIEF DESCRIPTION OF THE DRAWINGS

FIG. 3 shows a sinusoidal signal generated by the circuit according to FIG. 1, together with an error curve indicating the deviations from an ideal sinusoidal waveform.

DESCRIPTION OF THE PREFERRED EMBODIMENT

Figure 1:
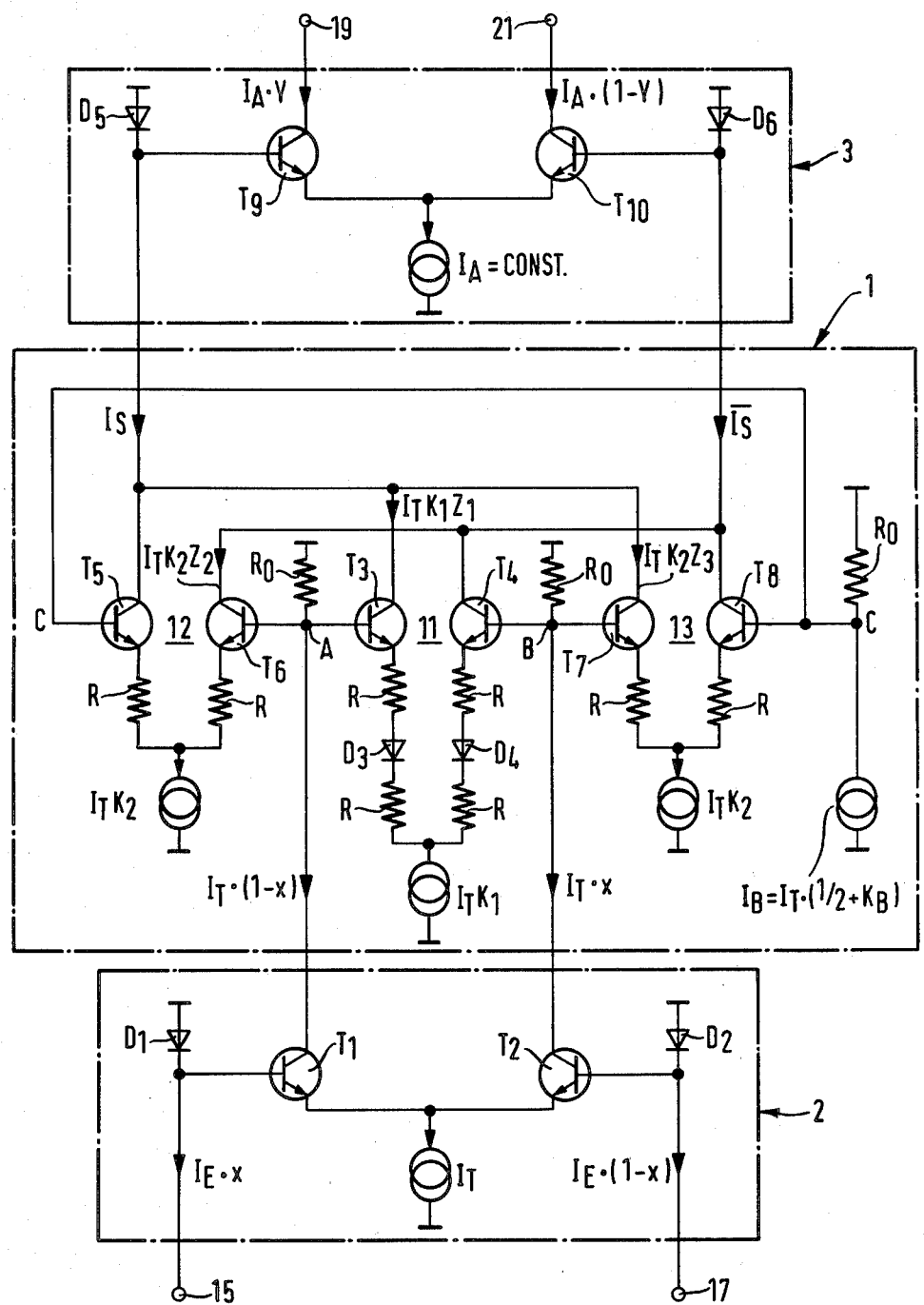
FIG. 1 is a circuit diagram of a preferred embodiment of the invention for converting a triangular signal into a sinusoidal signal.

The circuit according to FIG. 1 consists of three main parts, namely a sine shaper 1, an input multiplier 2, and an output multiplier 3. The sine shaper 1 comprises three differential amplifiers 11, 12 and 13 the operation of which is explained below.

Input multiplier 2 comprises two NPN-transistors $T_1$ and $T_2$ having their emitters connected to a common current source $I_T$. The bases of transistors $T_1$ and $T_2$ are respectively connected via diodes $D_1$ and $D_2$ to ground and are also respectively connected to input terminals 15 and 17. Input terminals 15 and 17 are connected to input currents $I_E \cdot x$ and $I_E \cdot (1-x)$, respectively where $I_E$ is constant and where x is the time variable part of the input current and is triangular in the present case.

The purpose of input multiplier 2 is to convert the temperature-independent input current into a temperature-dependent one. Thus, current source $I_T$ is designed to deliver a current proportional to the absolute temperature. The output currents of input multiplier 2 are now $I_T(1-x)$ and $I_T(x)$, respectively, and thus are also proportional to the absolute temperature. The collectors of transistors $T_1$ and $T_2$ carrying these currents are connected to nodes A and B, respectively, which nodes are connected to ground via resistors $R_O$. The voltage drop between nodes A and B is proportional to the absolute temperature.

Node A is also connected both to the base of an NPN-transistor $T_3$ of differential amplifier 11 as well as to the base of an NPN-transistor $T_6$ of differential amplifier 12. Node B is connected to the base of the other NPN-transistor $T_4$ of differential amplifier 11 as well as to the base of an NPN-transistor $T_7$ belonging to differential amplifier 13. The other NPN-transistors $T_5$ and $T_8$ of differential amplifiers 12 and 13, respectively, have their bases connected to a node C which is connected via a resistor $R_O$ to ground and is also connected to a current source $I_B = I_T(\frac{1}{2} + K_B)$ where $K_B$ is a constant.

Differential amplifier 11 is the main waveform shaper while the purpose of differential amplifiers 12 and 13 is to correct the transfer characteristic of differential amplifier 11 in such a manner that the resulting sinusoidal signal has no bends, i.e. has a continuous first derivative. In addition to transistors $T_3$ and $T_4$ differential amplifier 11 includes two diodes $D_3$ and $D_4$ which respectively connect the emitters of transistors $T_3$ and $T_4$ to a common current source $I_T K_1$ where $K_1$ is a constant. Bulk, lead and discrete emitter resistances of differential amplifiers 11, 12 and 13 are schematically represented by resistors R. The emitters of transistors $T_5$ and $T_6$ as well as of transistors $T_7$ and $T_8$ are connected to current sources $I_T K_2$ where $K_2$ is a constant.

In the present embodiment all transistors are equal and the following relationships exist between the voltage differences across nodes A and B, A and C and B and C and the output currents of the differential amplifiers 11, 12, and 13:

$$U_{AB} = 2U_T \ln \frac{z_1}{1-z_1} + 2I_T R K_1 (2z_1 - 1) \quad (1)$$

$$U_{AC} = U_T \ln \frac{z_2}{1-z_2} + I_T R K_2 (2z_2 - 1) \quad (2)$$

$$U_{BC} = U_T \ln \frac{z_3}{1-z_3} + I_T R K_2 (2z_3 - 1) \quad (3)$$

where $U_T$ is the so-called thermal voltage proportional to the absolute temperature and $z_1$, $z_2$ and $z_3$ are the time variable voltage coefficients caused by the time variable coefficient x at the input of sine shaper 1.

The collectors of transistors $T_3$, $T_5$ and $T_7$ on the one hand and of transistors $T_4$, $T_6$ and $T_8$, respectively, on the other hand are connected to each other and deliver resulting currents $I_S$ and $\overline{I_S}$. Currents $I_S$ and $\overline{I_S}$ already have a sinusoidal waveform but are dependent on temperature. By means of output multiplier 3 this dependence on termperature is eliminated. Output multiplier 3 consists of two NPN-transistors $T_9$ and $T_{10}$ having their emitters connected to a common constant current source $I_4$. The bases of transistors $T_9$ and $T_{10}$ are connected to ground via diodes $D_5$ and $D_6$, respectively, and are also connected to the outputs of sine shaper 1 carrying the currents $I_S$ and $\overline{I_S}$. The output currents of output multiplier 3 at terminals 19 and 21, respectively, are $I_4 \cdot y$ and $I_4 \cdot (1-y)$, respectively, where y is the sinusoidally variable coefficient.

In the described embodiment x is between 0.25 and 0.75, and $I_T$ is 10 mA at 25° C. The following convenient values have been found empirically:

$R = 4.4\Omega$
$R_O = 40\Omega$
$K_1 = 0.64$
$K_2 = 0.179$
$K_B = 0.35$

The output signals at terminals 19 and 21 of the circuit according to FIG. 1 are temperature-independent. In equations (1), (2) and (3) all terms are proportional to the absolute temperature. $I_S$ and $\overline{I_S}$ are thus also proportional to the absolute temperature. Temperature-dependence is then compensated by output multiplier 3.

Figure 2:
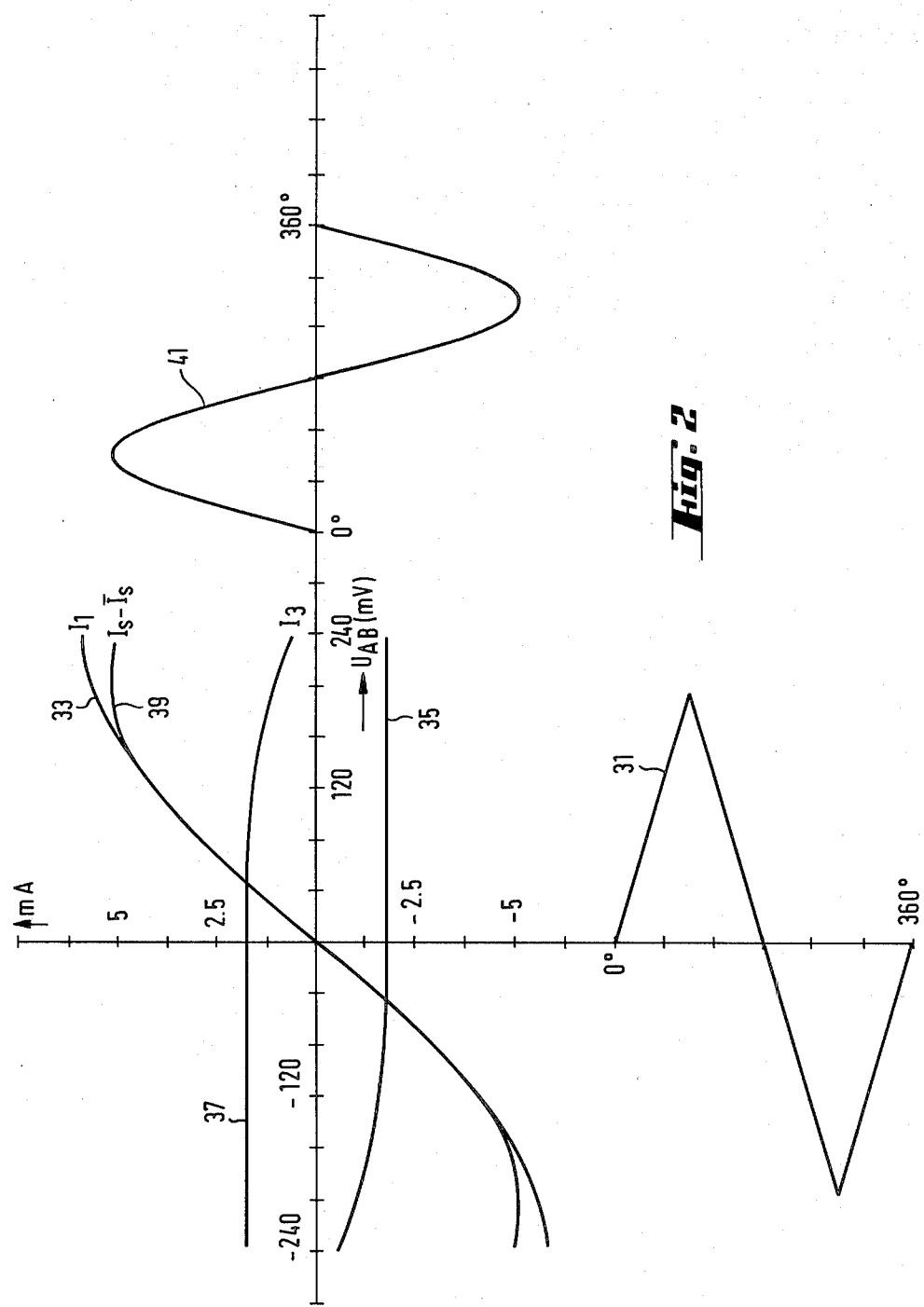
FIG. 2 illustrates how the resulting transfer characteristic of the circuit according to FIG. 1 is generated as a combination of three transfer characteristics.

FIG. 2 illustrates how the resulting characteristic of sine shaper 1 is generated. Reference numeral 31 indicates the triangular waveform representing the input signal $U_{AB}$ of sine shaper 1. Reference numeral 33 indicates the transfer characteristic of differential amplifier 11. It can be seen that characteristic 33 approximates horizontal asymptotes for large positive and negative voltages $U_{AB}$ but does not reach zero slope. Zero slope for the circuit transfer characteristic can be achieved by linear superposition of the transfer characteristics 35 and 37 of differential amplifiers 12 and 13 (FIG. 1), respectively, as can be seen in the diagram according to FIG. 2. Characteristics 35 and 37 have slopes opposite to that of characteristic 33. Moreover the operating points on characteristics 35 and 37 are shifted from the center thereof in opposite directions by equal amounts. The resulting transfer characteristic of the circuit is indicated by reference numeral 39. The waveform 41 is the sinusoidal differential output current $I_S - \overline{I_S}$ as a function of time.

In FIG. 2 currents $I_1$, $I_2$ and $I_3$ are the differential currents of differential amplifiers 11, 12 and 13 respectively. The following equations apply:

$I_1 = I_T K_1 (2z_1 - 1)$ $I_2 = I_T K_2 (2z_2 - 1)$ $I_3 = I_T K_2 (2z_3 - 1)$ $I_S - \overline{I_S} = I_1 + I_2 + I_3$ FIG. 3 shows the deviations of the sinusoidal signal 41 (FIG. 2) from an ideal sinusoidal waveform. As can be seen from error curve 43 the maximum error is ±2.2%. Harmonic distortions are at about 60 dB.

The circuit described above is suitable for frequencies up to 100 MHz (transition frequency 1 GHz).

I claim:

1. A circuit for converting a triangular waveform into a sinusoidal waveform comprising:
   a first transistor differential amplifier having a first non-linear transfer characteristic with a first slope;
   input means for supplying said first differential amplifier with a triangular input signal symmetrical to the operating point of said first differential amplifier said operating point being located in the center of said first non-linear characteristic;
   output means for deriving an approximately sinusoidal signal from said first differential amplifier; and
   second and third transistor differential amplifiers parallel-connected to said first differential amplifier, said second and third differential amplifiers having second and third non-linear characteristics with second and third slopes opposite to said first slope and having their operating points shifted on said second and third characteristics in opposite directions with regard to each other and symmetrically to the operation point of said first differential amplifier, the resulting overall characteristic of said first, second and third differential amplifiers having zero slope at the extremal amplitudes of said triangular input signal.

2. A circuit as in claim 1, wherein said second and third differential amplifiers each are connected with the base of one of their two transistors to the bases of different ones of the two transistors of said first differential amplifier and are connected with the bases of their respective second transistors to a common current source.

3. A circuit for converting a triangular waveform into a sinusoidal waveform comprising:
   a first transistor differential amplifier having a first non-linear transfer characteristic with a first slope;
   input multiplier for supplying said first differential amplifier with a triangular input signal symmetrical to the operating point of said first differential amplifier said operating point being located in the center of said first non-linear characteristic;
   output multiplier for deriving an approximately sinusoidal signal from said first differential amplifier;
   second and third transistor differential amplifiers parallel-connected to said first differential amplifier, said second and third differential amplifiers having second and third non-linear characteristics with second and third slopes opposite to said first slope and having their operating points shifted on said second and third characteristics in opposite directions with regard to each other and symmetrically to the operation point of said first differential amplifier, the resulting overall characteristic of said first, second and third differential amplifiers having zero slope at the extremal amplitudes of said triangular input signal;

said second and third differential amplifiers each having the base of one of their two transistors connected to the bases of different ones of the two transistors of said first differential amplifier and having the bases of their respective second transistors connected to a common current source; and said input multiplier and said first, second and third differential amplifiers being supplied with a current proportional to the absolute temperature and said output multiplier being supplied with a constant current.

* * * * *